(12) United States Patent
Joerg

(10) Patent No.: US 6,518,821 B2
(45) Date of Patent: Feb. 11, 2003

(54) PARALLEL CIRCUIT COMPRISING A PLURALITY OF IGBTS

(75) Inventor: Pieder Joerg, Domat/Ems (CH)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 09/948,063

(22) Filed: Sep. 7, 2001

(65) Prior Publication Data

US 2002/0145453 A1 Oct. 10, 2002

(30) Foreign Application Priority Data

Sep. 15, 2000 (EP) .................................. 00810837

(51) Int. Cl.[7] ............................................. H03K 17/687
(52) U.S. Cl. ......................... 327/437; 327/434; 327/112
(58) Field of Search ................................ 327/108, 112, 327/389, 391, 427, 434, 436, 437, 111, 440; 326/83, 87

(56) References Cited

U.S. PATENT DOCUMENTS 5,949,273 A * 9/1999 Mourick et al. ............ 327/442
6,323,717 B1 * 11/2001 Omura et al. ............... 327/434
6,326,819 B1 * 12/2001 Carlson ...................... 327/108

FOREIGN PATENT DOCUMENTS

EP 0 818 889 1/1998

OTHER PUBLICATIONS

"IGBT Module LoPak5 SPT 5SNS0300U120100 Marketing Information", ABB Semiconductors AG, Jul. 10, 2000, pp. 1–4.

* cited by examiner

Primary Examiner—Terry D. Cunningham
Assistant Examiner—Long Nguyen
(74) Attorney, Agent, or Firm—Burns, Doane, Swecker & Mathis, L.L.P.

(57) ABSTRACT

In a parallel circuit (10) comprising a plurality of high-power IGBTs (T1, . . . ,T3) which are each driven by a dedicated gate drive circuit (GD1,. . . ,GD3), each of the gate drive circuits (GD1,. . . ,GD3) having, at its output, a p-channel MOSFET (M1, M3, M5) and an n-channel MOSFET (M2, M4, M6) in a push-pull arrangement and the outputs of the gate drive circuits (GD1, . . . ,GD3) being connected to the gates of the IGBTs (T1,. . . ,T3) in each case via a gate resistor (R1,. . . ,R3), a parallel circuit comprising more than two gate drive circuits is made possible by virtue of the fact that the outputs of the gate drive circuits (GD1,. . . ,GD3) are interconnected via a connecting line (11), and that the MOSFETs (M1,. . . ,M6) of the gate drive circuits (GD1,. . . ,GD3) are in each case connected to a positive or negative supply terminal (P1, . . . ,P3 or N1, . . . ,N3) via a constant-current source (CS1,. . . ,CS6).

3 Claims, 1 Drawing Sheet

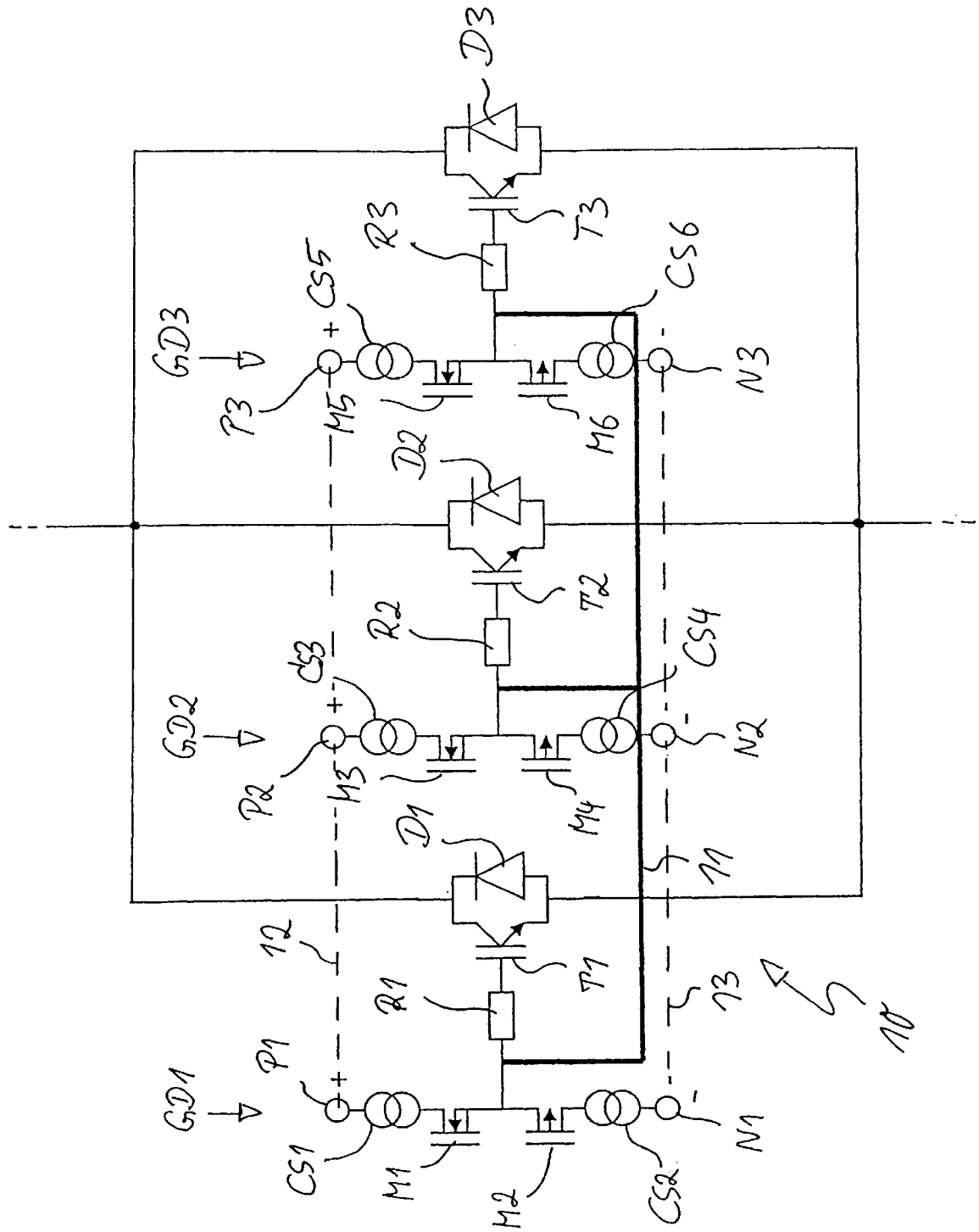

PARALLEL CIRCUIT COMPRISING A PLURALITY OF IGBTS

FIELD OF THE INVENTION

The present invention concerns the field of power electronics. It relates to a parallel circuit comprising a plurality of IGBTs.

BACKGROUND OF THE INVENTION

For a relatively long time power electronic semiconductor modules have been commercially available in which up to six high-power IGBTs with corresponding reverse-connected parallel diodes are arranged and interconnected in such a way that they can either form the individual arms of a three-phase power converter bridge or can be combined by being connected in parallel to form a single phase arm with three-fold current-carrying capacity. Modules of this type are offered by the applicant under the general type designation LoPak5 and have, by way of example, a collector-emitter voltage $V_{CE}$ of 1200 V and a collector current $I_c$ of 300 A (see the data sheet 5SYA1528 from ABB Semiconductors AG relating to the module type 5SNS030OU120100 of Jul. 1, 2000).

The parallel circuit comprising such high-power IGBTs on the power side (i.e. by connecting the collector-emitter paths of the individual IGBTs in parallel) throws up various problems:

If the IGBTs with their associated gate drive circuits ("gate drives") are only connected in parallel on the power side without further measures, considerable unequal distribution of the currents between the individual IGBTs can occur dynamically due to different delays in the gate drive circuits during the switching of the IGBTs. Since the individual gates of the IGBTs are not connected to one another, the positive transistor behavior of the IGBTs does not help either.

If the gates of the IGBTs are likewise connected in parallel, the IGBTs, owing to their fundamental transistor behavior, naturally have the tendency to statically divide the currents identically among themselves: identical transistors have identical $I_{CE}/V_{CE}$ characteristics and - since they have the same $V_{CE}$ and the same gate voltage - they must also draw the same collector-emitter current $I_{CE}$. Dynamically, however, the currents can differ considerably. The absolute values of the gate resistances as well as the ratio of individual and common resistances in the module influence the balance between the currents.

The output stage of a gate drive circuit used for such IGBTs is usually a push-pull stage constructed with two MOSFETs (p-channel and n-channel MOSFETs). If two gate drive circuits are connected in parallel, it must be ensured that one gate drive circuit does not break down to the other and that one gate drive circuit does not "charge" the other. The simplest solution is to use individual gate resistors for decoupling the gate drive circuits. However, such a solution can only be realized for two gate drive circuits connected in parallel.

SUMMARY OF THE INVENTION

It is an object of the invention, therefore, to specify a parallel circuit comprising high-power IGBTs in which more than two gate drive circuits are connected in parallel.

The essence of the invention is that the MOSFETs in the output stages of the gate drive circuits are in each case connected to a positive or negative supply terminal via a constant-current source and the outputs of the gate drive circuits are interconnected via a connecting line. In this case, the constant-current sources are designed as "weak" constant-current sources and are constructed in a manner known per se from a transistor or MOSFET and diodes and/or resistors.

In order that the power supplies of the gate drive circuits are at least uniformly loaded, it is advantageous if the positive and negative supply terminals of the gate drive circuits are respectively interconnected by connecting lines.

BRIEF DESCRIPTION OF THE DRAWINGS

The invention will be explained in more detail below using an exemplary embodiment in connection with the drawing. The single figure shows the circuit diagram of a preferred exemplary embodiment of a parallel circuit according to the invention.

DETAILED DESCRIPTION OF THE INVENTION

The figure illustrates a parallel circuit comprising three IGBTs T1, . . . ,T3 in accordance with a preferred exemplary embodiment of the invention. The IGBTs (Insulated Gate Bipolar Transistors) T1, . . . ,T3 with their reverse-connected parallel diodes D1, . . . ,D3 may, for example, be part of a power semiconductor module, as was mentioned in the introduction, and as is used to form controlled power converter bridges. The IGBTs are connected in parallel on the power side and thus form, for example, an arm of a power converter bridge with three-fold current-carrying capacity. Each of the IGBTs T1, . . . ,T3 is driven by an associated gate drive circuit ("gate drive") GD1, . . . ,GD3 via a gate resistor R1, . . . ,R3, of which drive circuit only the output stage equipped with MOSFETs M1, . . . ,M6 is illustrated, for the sake of simplicity.

In each of the gate drive circuits GD1, . . . ,GD3, a p-channel MOSFET (M1, M3, M5) and an n-channel MOSFET (M2, M4, M6) in a push-pull arrangement are provided in the output stage. Each of the MOSFETs M1 , . . . ,M6 is connected to a positive or negative supply terminal P1, . . . ,P3 or N1, . . . ,N3 via an associated constant-current source CS1, . . . , CS6. The constant-current sources CS1, . . . , CS6 are constructed as "weak" constant-current sources from a transistor or MOSFET and diodes and/or resistors.

The outputs of the gate drive circuits GD1, . . . ,GD3, i.e. the junction points between the MOSFET pairs in the output stage, are interconnected via a common first connecting line 11, and are thus connected in parallel. The positive supply terminals P1, . . . ,P3 are interconnected by a second connecting line 12 and the negative supply terminals N1, . . . ,N3 are interconnected by a third connecting line 13.

Although the problem of unequal distribution of the loading between the gate drive circuits GD1, . . . , GD3 remains, i.e. the gate drive circuits to be driven first is always subjected to the greatest loading, the loading is limited to a predetermined value by the circuit construction according to the invention. At the same time, the power supplies of the gate drive circuits GD1, . . . , GD3 are uniformly loaded by the connection of the supply terminals P1, . . . , P3 and N1, . . .,N3.

LIST OF REFERENCE SYMBOLS

10 Parallel circuit

11 Connecting line (gate drive circuit)

12, 13 Connecting line (supply terminals)
CS1, ..., CS6 Constant-current source
D1, ..., D3 Diode
GD1, ..., GD3 Gate drive circuit (gate drive)
M1, ..., M6 MOSFET transistor
N1, ..., N3 Negative supply terminal
P1, ..., P3 Positive supply terminal
R1, ..., R3 Gate resistor
T1, ..., T3 IGBT

What is claimed is:

1. A parallel circuit comprising a plurality of high-power IGBTs which are each driven by a dedicated gate drive circuit, each of the gate drive circuits having, at its output, a p-channel MOSFET and an n-channel MOSFET in a push-pull arrangement and the outputs of the gate drive circuits being connected to the gates of the IGBTs in each case via a gate resistor, wherein the outputs of the gate drive circuits are interconnected via a connecting line, and in that the MOSFETs of the gate drive circuits are in each case connected to a positive or negative supply terminal via a constant-current source .

2. The parallel circuit as claimed in claim 1, wherein the constant-current sources are constructed from a) a transistor or MOSFET, and b) diodes and/or resistors.

3. The parallel circuit as claimed in claim 1, wherein the positive and negative supply terminals of the gate drive circuits are respectively interconnected by connecting lines.

* * * * *